(12) United States Patent
Kato et al.

(10) Patent No.: US 8,159,257 B2
(45) Date of Patent: Apr. 17, 2012

(54) ELEMENT SUBSTRATE, INSPECTING METHOD, AND MANUFACTURING METHOD OF SEMICONDUCTOR DEVICE

(75) Inventors: Kiyoshi Kato, Kanagawa (JP); Konami Izumi, Kanagawa (JP); Masahiko Hayakawa, Kanagawa (JP); Koichiro Kamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/910,426

(22) Filed: Oct. 22, 2010

(65) Prior Publication Data

US 2011/0089955 A1  Apr. 21, 2011

Related U.S. Application Data

(62) Division of application No. 11/817,435, filed as application No. PCT/JP2006/304519 on Mar. 2, 2006, now Pat. No. 7,821,279.

(30) Foreign Application Priority Data

Mar. 7, 2005 (JP) ................. 2005-061717

(51) Int. Cl.
*G01R 31/26* (2006.01)
(52) U.S. Cl. .............. 324/762.01; 324/750.3; 438/14
(58) Field of Classification Search .............. None
See application file for complete search history.

(56) References Cited

U.S. PATENT DOCUMENTS

| | | | |
|---|---|---|---|
| 5,821,138 A | 10/1998 | Yamazaki et al. | |
| 6,376,333 B1 | 4/2002 | Yamazaki et al. | |
| 6,759,863 B2 * | 7/2004 | Moore | 324/762.03 |
| 6,850,080 B2 | 2/2005 | Hiroki | |
| 6,998,282 B1 | 2/2006 | Yamazaki et al. | |
| 7,105,365 B2 | 9/2006 | Hiroki et al. | |
| 7,183,788 B2 | 2/2007 | Moore | |
| 7,231,310 B2 | 6/2007 | Asano et al. | |
| 8,028,208 B2 | 9/2011 | Moore | |
| 2003/0006795 A1 | 1/2003 | Asayama et al. | |
| 2004/0164760 A1 | 8/2004 | Moore | |
| 2005/0162421 A1 | 7/2005 | Yamazaki et al. | |
| 2005/0162578 A1 | 7/2005 | Yamazaki et al. | |
| 2005/0212044 A1 | 9/2005 | Hiroki | |

(Continued)

FOREIGN PATENT DOCUMENTS

JP    7-130803    5/1995

(Continued)

OTHER PUBLICATIONS

International Search Report re application No. PCT/JP2006/304519, dated Jun. 6, 2006.

(Continued)

*Primary Examiner* — Minh N Tang
(74) *Attorney, Agent, or Firm* — Husch Blackwell LLP

(57) ABSTRACT

A substrate including a semiconductor layer, where characteristics of an element can be evaluated with high reliability, and an evaluating method thereof are provided. A substrate including a semiconductor layer of the invention has a closed-loop circuit in which an antenna coil and a semiconductor element are connected in series, and a surface of an area over which the circuit is formed is covered with an insulating film. By using such a circuit, a contactless inspection can be carried out. Further, a ring oscillator can be substituted for the closed-loop circuit.

8 Claims, 17 Drawing Sheets

U.S. PATENT DOCUMENTS

| | | |
|---|---|---|
| 2006/0164115 A1 | 7/2006 | Komiya et al. |
| 2006/0263952 A1 | 11/2006 | Hiroki et al. |

FOREIGN PATENT DOCUMENTS

| | | |
|---|---|---|
| JP | 8-334541 | 12/1996 |
| JP | 2003-31814 | 1/2003 |
| JP | 2003-188416 | 7/2003 |
| JP | 2003-271912 | 9/2003 |
| JP | 2003-533882 | 11/2003 |
| JP | 2004-37213 | 2/2004 |
| JP | 2004-150840 | 5/2004 |
| JP | 2004-297084 | 10/2004 |
| WO | WO 01/88976 A2 | 11/2001 |

OTHER PUBLICATIONS

Written Opinion re application No. PCT/JP2006/304519, dated Jun. 6, 2006.

Office Action re Chinese application No. CN 200680007477.6, dated Sep. 25, 2009 (with English translation).

\* cited by examiner

701

702

US 8,159,257 B2

ELEMENT SUBSTRATE, INSPECTING METHOD, AND MANUFACTURING METHOD OF SEMICONDUCTOR DEVICE

This application is a divisional of application Ser. No. 11/817,435 filed on Aug. 30, 2007 (now U.S. Pat. No. 7,821,279 issued Oct. 26, 2010) which is the US National stage of PCT/JP2006/304519 filed Mar. 2, 2006.

TECHNICAL FIELD

The present invention relates to an element substrate, an inspecting method, and a manufacturing method of a semiconductor device using the inspecting method.

BACKGROUND ART

In recent years, development of a semiconductor device for transmitting/receiving data wirelessly (referred to as a wireless chip, an RFID tag, and the like) has been advanced.

In general, in the case of manufacturing an LSI chip, an element or a circuit for evaluating characteristics, which is referred to as a TEG (test elementary group) is formed over a substrate for forming the LSI chip. A manufacturing process of the LSI chip or a parameter used for designing an LSI can be tested by evaluating the TEG. A wireless chip is also formed of an LSI chip, and a TEG is provided over a substrate for forming the LSI chip in order to test a manufacturing process, and the like.

Further, in an inspecting process of a semiconductor device, a non-contact inspecting process is suggested (see Patent Document 1).
[Patent Document 1] Japanese Patent Laid-Open No. 2003-31814

DISCLOSURE OF INVENTION

Although an LSI chip formed over a silicon wafer is known as an LSI chip for forming a wireless chip at present, development of a chip provided over a flexible substrate (hereinafter referred to as a flexible chip) has been advanced. The flexible chip can be used for various applications since it is very thin and flexible.

The chip is usually evaluated by bringing a pin referred to as a prober into contact with a substrate over which a TEG is formed so as to measure electrical characteristics. That is, the electrical characteristics are measured by contact. However, it is difficult to measure the flexible chip automatically by contact with a pin since it is at high risk for damaging a thin semiconductor layer. Therefore, in order to measure by contact, it is required that a pin is accurately brought into contact with the chip by hand or a predetermined anisotropic conductive film is used, which takes a lot of time and effort.

Thus, it is difficult to measure the flexible chip efficiently with high reliability.

Further, a TEG is at risk of electrostatic breakdown through an electrode pad. Such a problem is caused by exposing an electrode. Therefore, a TEG including as few electrode pads as possible or no electrode pads, and a method for evaluating such a TEG are effective for improving the reliability of evaluation of a TEG.

Thus, the invention provides a TEG capable of evaluating characteristics of a semiconductor element without being in contact with an electrode as much as possible or at all by using a wireless technology, an element substrate over which the TEG is formed, and a measuring method thereof.

In order to solve the problems, the following means are used in the invention.

The invention provides an element substrate provided with a test elementary group (TEG) including a closed loop circuit in which an antenna coil and a semiconductor element are connected in series, wherein a surface of an area over which the closed loop circuit is provided is covered with an insulating film. The characteristics of a semiconductor element can be evaluated by using the element substrate.

Another mode of the invention provides a flexible element substrate provided with a TEG including a closed loop circuit in which an antenna coil and a semiconductor element are connected in series. The characteristics of a semiconductor element can be evaluated by using the flexible element substrate.

Another mode of the invention provides an element substrate provided with a TEG including a closed loop circuit in which an antenna coil, a capacitor, and a semiconductor element are connected in series, wherein a surface of an area over which the closed loop circuit is provided is covered with an insulating film. The characteristics of a semiconductor element can be evaluated by using the element substrate.

Another mode of the invention provides a flexible element substrate provided with a TEG including a closed loop circuit in which an antenna coil, a capacitor, and a semiconductor element are connected in series. The characteristics of a semiconductor element can be evaluated by using the flexible element substrate.

Another mode of the invention provides an element substrate provided with a TEG including an antenna coil, a power source circuit, a ring oscillator, and a transistor, wherein the power source circuit supplies a power source voltage to the ring oscillator, the antenna coil is connected to a circuit in which load modulation is carried out at the oscillation frequency of the ring oscillator, and a surface of an area over which the power source circuit, the ring oscillator, and the transistor are provided is covered with an insulating film. The characteristics of a semiconductor element can be evaluated by using the element substrate.

Another mode of the invention provides a flexible element substrate provided with a TEG including an antenna coil, a power source circuit, a ring oscillator, and a transistor, wherein the power source circuit supplies a power source voltage to the ring oscillator, and the antenna coil is connected to a circuit in which load modulation is carried out at the oscillation frequency of the ring oscillator. The characteristics of a semiconductor element can be evaluated by using the flexible element substrate.

Another mode of the invention provides an element substrate provided with a TEG including an antenna coil, a ring oscillator, a transistor, and an electrode pad for supplying a power source voltage to the ring oscillator, wherein the antenna coil is connected to a circuit in which load modulation is carried out at the oscillation frequency of the ring oscillator, and a surface of an area in which the power source circuit, the ring oscillator and the transistor are provided is formed of the electrode pad or an insulating film. The characteristics of a semiconductor element can be evaluated by using the element substrate.

Another mode of the invention provides a flexible element substrate provided with a TEG including an antenna coil, a ring oscillator, a transistor, and an electrode pad for supplying a power source voltage to the ring oscillator, wherein the antenna coil is connected to a circuit in which load modulation is carried out at the oscillation frequency of the ring oscillator. Characteristics of a semiconductor element can be evaluated by using the flexible element substrate.

According to an inspecting method of the invention, the characteristics of a semiconductor element are evaluated by applying electromagnetic waves to any of the aforementioned element substrates and measuring power absorbed by the element substrate.

According to the invention, electromagnetic waves are applied by using a measuring device capable of discharging a controllable electromagnetic wave from an antenna.

According to an inspecting method of the invention, power absorbed by an element substrate is measured by a magnetic field prober.

By using an inspecting method of the invention, static characteristics or dynamic characteristics of a semiconductor element provided over an element substrate can be evaluated in a contactless manner.

According to a manufacturing method of a semiconductor device of the invention, a TEG including a first semiconductor layer and a thin film transistor including a second semiconductor layer are formed over an inflexible substrate; the TEG is inspected in a contact manner; the inflexible substrate is peeled off; the TEG and the thin film transistor are transferred over a flexible substrate; characteristics of the thin film transistor is evaluated by inspecting the TEG, which is transferred over the flexible substrate in a contactless manner; and a substrate which has acceptable characteristics of a thin film transistor is cut.

In another manufacturing method of a semiconductor device of the invention, a TEG including a first semiconductor layer and a thin film transistor including a second semiconductor layer over an inflexible substrate; the TEG is inspected in a contact manner; the inflexible substrate is peeled off; the TEG and the thin film transistor are transferred over a flexible substrate; the characteristics of the thin film transistor are evaluated by inspecting the TEG, which is transferred over the flexible substrate, in a contactless manner; a substrate which has acceptable characteristics of a thin film transistor is cut; and the thin film transistor over the cut substrate is inspected.

According to a manufacturing method of a semiconductor device of the invention, voltage-current characteristics of a TEG are evaluated by inspecting in a contact manner; the characteristics of a thin film transistor are evaluated by inspecting the TEG, which is transferred over a flexible substrate, in a contactless manner; and a substrate which has acceptable voltage-current characteristics of a thin film transistor is cut.

By the invention, even in the case where it is difficult that a measurement is carried out by bringing a pin into contact with an electrode pad, the characteristics of an element can be evaluated efficiently and with high reliability. Further, electrostatic breakdown of an evaluating element can be suppressed by downsizing the area of an exposed surface of an electrode as much as possible, thereby the characteristics of an element can be evaluated with high reliability. Accordingly, a manufacturing process or a parameter used for designing can be inspected efficiently.

BEST MODE FOR CARRYING OUT THE INVENTION

Figure 1:
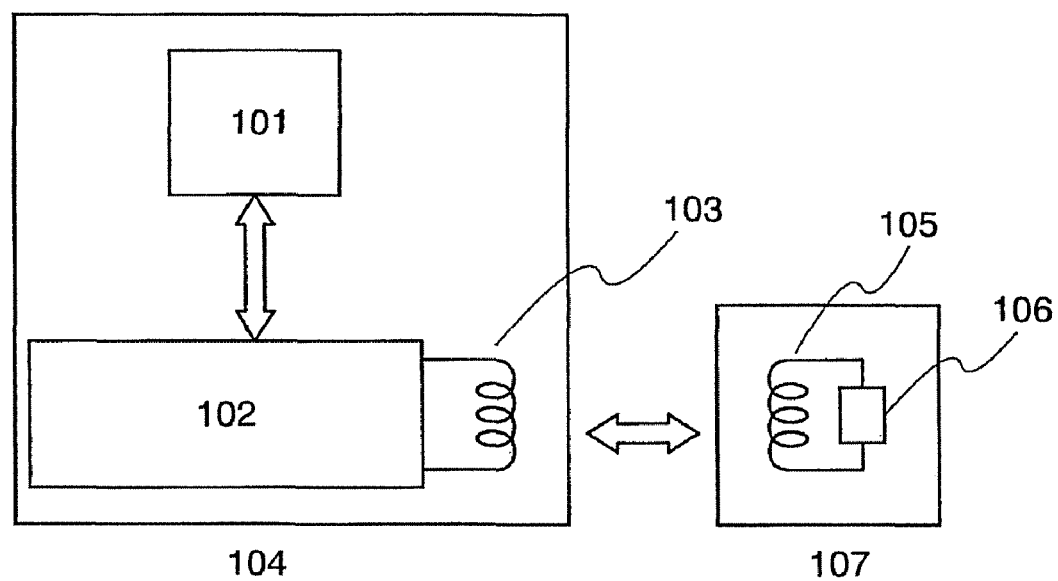
FIG. 1 is a block diagram of an element substrate and a measuring device of the invention.

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Further, identical portions in configurations of the invention may be denoted by the same reference numerals in different drawings.

Embodiment Mode 1

Description is made on an element substrate including a TEG of the invention and a measuring method of the characteristics of a semiconductor element using the element substrate with reference to FIG. 1.

An element substrate 107 of the invention has as a TEG a configuration where an antenna coil 105 and a semiconductor element 106 are connected in series, that is, a closed loop circuit.

A thin film transistor evaluated by a TEG is provided over the element substrate. A semiconductor device such as a wireless chip is formed by the thin film transistor. The thin film transistor and the TEG have a similar configuration, and for example, each has a semiconductor layer formed over a base film. The semiconductor layers of the TEG and the thin film transistor are formed at the same time in the same process. In addition, each of the thin film transistor and the TEG has a gate insulating film provided so as to cover the semiconductor layer, a gate electrode provided over the semiconductor layer with the gate insulating film interposed therebetween, an insulating film provided so as to cover the gate electrode and the semiconductor layer, a wire formed at an aperture portion of the insulating film and connected to an impurity area in the semiconductor layer, and a protective film provided over the wire, and the like. The protective film is preferably formed of an insulating film containing nitrogen, and provided over the entire element substrate 107 to prevent an impurity element such as an alkaline metal from entering the semiconductor layer. The protective film covers the wire and the like; therefore it becomes difficult to inspect in a contact manner.

In the case of forming a wireless chip, that is, a contactless chip as an example of a semiconductor device, an antenna coil is mounted on the chip, specifically, the antenna coil is connected to a wire which is connected to an impurity area. Therefore, the antenna coil and the wire can be formed at the same time. Needless to say, the antenna coil can be formed at the same time as the gate electrode. In this case, however, the antenna coil is required to be connected through a contact hole by a conductive layer so as to be connected to the wire.

Further, there is a case where a contact chip is formed as an example of a semiconductor device. In this case, the wire for connecting to the antenna coil may be exposed.

Since a TEG has a configuration where the antenna coil 105 and the semiconductor element 106 are connected in series, the antenna coil is mounted on the TEG. The antenna coil can be formed at the same time as a wire or a gate electrode. The antenna coil can be formed from a conductive material such as copper (Cu), silver (Ag), or gold (Au), or a light-transmissive conductive material such as indium tin oxide (ITO) or indium tin oxide containing silicon oxide (ISO). In addition, the antenna coil can be formed by printing, a droplet discharge method typified by ink jet, sputtering, a vapor deposition method, or the like. Such an antenna coil is mounted on the TEG, thereby the TEG can be inspected in a contactless manner.

A measuring device 104 includes a radio wave interface 102, an antenna coil 103, a control circuit 101, and the like, and can radiate electromagnetic waves at predetermined frequency and power.

When electromagnetic waves are radiated from the measuring device 104, induced electromotive force is generated at both terminals of the antenna coil included at least in the TEG over the element substrate 107 by electromagnetic induction. Then, a current flows into the semiconductor element 106 included in the TEG in accordance with element characteristics, which means that a thin film transistor and a wire that form the semiconductor element 106 provided over the element substrate 107 absorb power depending on the characteristics of the semiconductor element 106. Then, data on the characteristics of the semiconductor element 106 can be obtained by measuring the amount of power absorbed by the measuring device 104. Since there is a correlation between the characteristics of the semiconductor element 106 and the characteristics of the thin film transistor, the characteristics of a circuit formed of the thin film transistor which forms a semiconductor device can be evaluated and inspected.

A model circuit of the measurement system shown in FIG. 1 is described with reference to FIG. 2.

Figure 2:
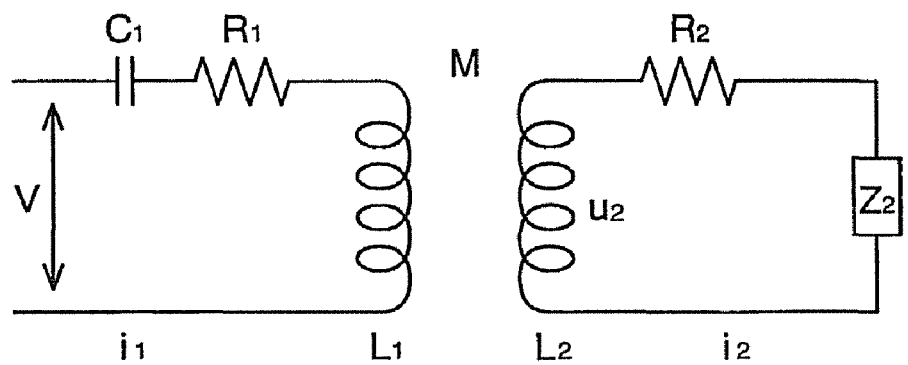
FIG. 2 is a circuit diagram showing the principle of evaluating a semiconductor element of the invention.

As shown in FIG. 2, the measuring device 104 includes a resonant circuit in which a capacitor having a capacitance $C_1$, and a coil having an inductance $L_1$ and a parasitic resistance $R_1$ are connected in series. Further, a current $i_1$ and a voltage V are applied to the resonant circuit. On the other hand, the semiconductor element 106 included in the TEG over the element substrate 107 has an impedance $Z_2$, and includes an antenna coil that seems to have an inductance $L_2$ and a parasitic resistance $R_2$. Note that the TEG of the invention is not provided with a resonant circuit. Further, the antenna coil of the measuring device 104 and the antenna coil 105 of the TEG have a mutual inductance M. An induced electromotive force $u_2$ is generated in such an antenna coil by electromagnetic waves radiated from the measuring device 104, and a current $i_2$ flows through the antenna coil.

The voltage V applied to the resonant circuit of the measuring device 104 in a circuit modeled in FIG. 2 is represented by Formula 1 under the resonant condition ($C_1 \cdot L_1 \cdot \omega^2 = 1$).

$$V = R_1 \times i_1 - M \times \frac{di_2}{dt} \qquad \text{[Formula 1]}$$

Further, since a current $i_2$ flowing into the semiconductor element 106 is represented by Formula 2 and the induced electromotive force $u_2$ is represented by Formula 3, Formula 4 for the voltage V can be obtained by assigning these formulas. Note that j denotes an imaginary unit.

$$i_2 = \frac{u_2}{R_2 + j \times \omega \times L_2 + Z_2} \qquad \text{[Formula 2]}$$

$$u_2 = M \times \frac{di_1}{dt} \qquad \text{[Formula 3]}$$

$$V = \left| R_1 + \frac{\omega^2 M^2}{R_2 + j \times \omega \times L_2 + Z_2} \right| \times i_1 \qquad \text{[Formula 4]}$$

Figure 3:
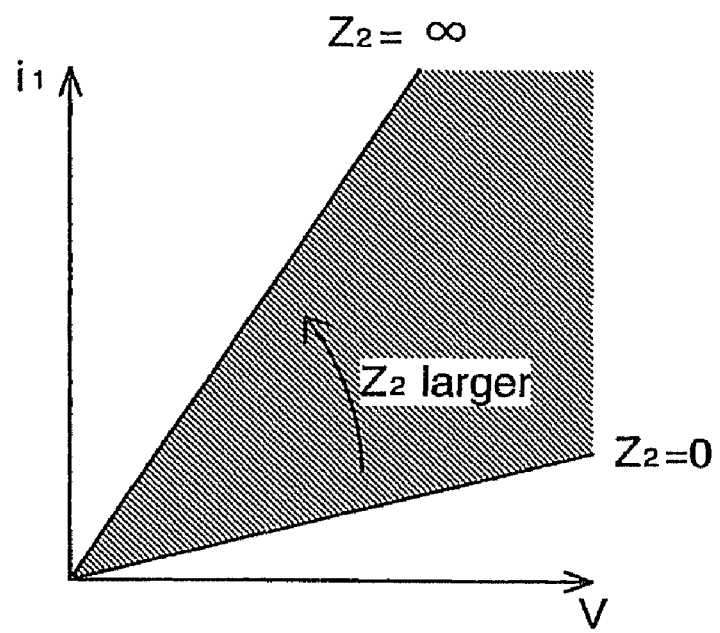
FIG. 3 is a graph showing a method of evaluating the characteristics of a semiconductor element of the invention.

Formula 4 shows that there is a proportional relationship between the voltage V and the current $i_1$ that are generated in the resonant circuit of the measuring device 104, and a proportionality coefficient is determined by $\omega$, $R_1$, M, $R_2$, $Z_2$, and $Z_2$. It is found that in the case where the impedance $Z_2$ of the semiconductor element 106 is changed by fixing $\omega$, $R_1$, M, $R_2$, and $L_2$, the voltage V and the current $i_1$ are represented by a graph shown in FIG. 3. The graph can be divided into an area in which the impedance $Z_2$ equals to 0, an area in which the impedance $Z_2$ has a certain value, and an area in which the impedance $Z_2$ is infinite. Note that, in the area in which the impedance $Z_2$ has a certain value, the current $i_1$ becomes larger with respect to the same voltage V as the impedance $Z_2$ is increased.

Since the amounts of the voltage V and the current $i_1$ that are applied to the antenna coil 103 of the measuring device 104 can be measured, data on the impedance $Z_2$ of the semiconductor element 106 of the TEG can be obtained from them. Based on such a principle, the semiconductor element 106 can be evaluated in a contactless manner. Then, a correlation between the characteristics of the semiconductor element 106 and the thin film transistor can be obtained since they are manufactured in the same process. Therefore, the characteristics of the thin film transistor, and the characteristics of a circuit and a semiconductor device formed of the thin film transistor can be inspected by the characteristics of the semiconductor element 106.

Subsequently, modes of the invention are described more specifically.

Figure 4:
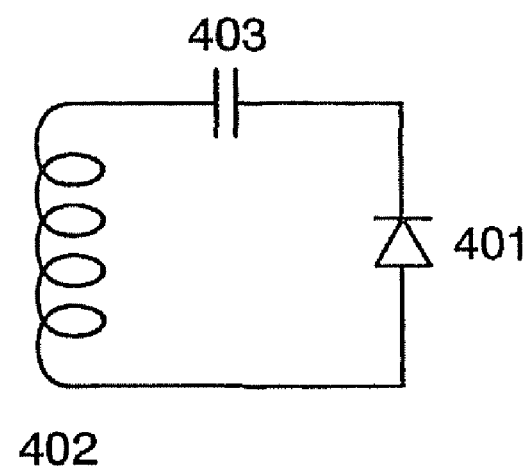
FIG. 4 is a circuit diagram formed over an element substrate of the invention.

FIG. 4 shows a model circuit configuration of an element substrate provided with a TEG which uses a diode 401 as a semiconductor element having the impedance $Z_2$ and includes an antenna coil 402. Note that, although FIG. 4 shows a configuration in which a capacitor 403 is connected in series to the antenna coil 402 and the diode 401, the capacitor 403 is not required to be provided. The capacitor 403 is provided to adjust a phase component of a signal. Therefore, in the case where the adjustment is not required, the capacitor 403 is not required to be provided. Note that in the case of providing the capacitor 403, capacitance is assumed to be included in the impedance in the formulas.

Subsequently, description is made on a method of evaluating a threshold voltage Uth of the diode 401 by using the element substrate shown in FIG. 4.

Figure 5A:
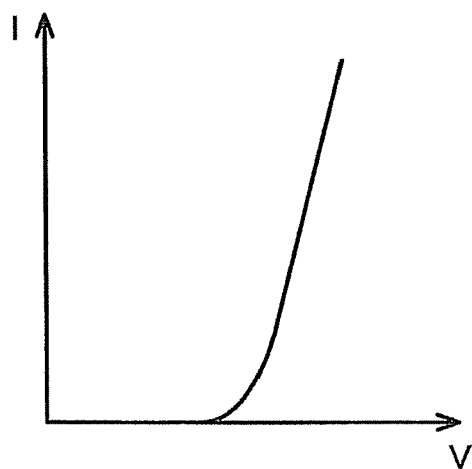
FIGS. 5A to 5C are graphs each showing a method of evaluating a semiconductor element of the invention.
Figure 5B:
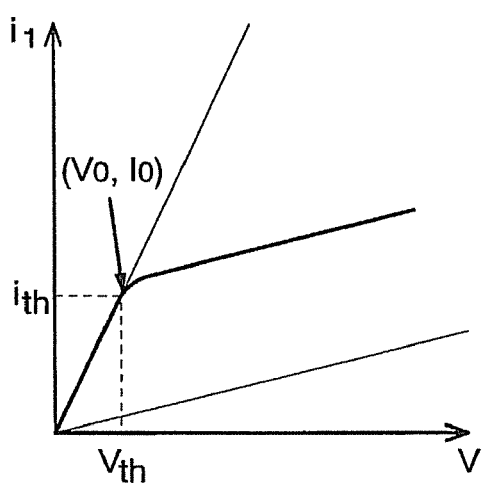

FIG. 5A is a graph of voltage-current characteristics (referred to as I-V characteristics) of the diode 401, and it is difficult that the characteristics are obtained directly without being in contact with an electrode. On the other hand, FIG. 5B is a graph showing a relation between the voltage V and the current $i_1$ that are generated in the resonant circuit of the measuring device 104, which is obtained by being measured in a contactless manner based on the above-mentioned principle. Note that, in FIG. 5B, a point ($V_0$, $I_0$) at which a slope changes drastically corresponds to a threshold voltage of the diode 401.

By thus obtaining the I-V characteristics of the diode 401 and the relation between $V_0$ and $I_0$ of the diode 401, the threshold voltage Uth of the diode 401 can be evaluated by only being measured in a contactless manner. In this way, by obtaining the I-V characteristics of the diode 401 and the relation between $V_0$ and $I_0$ of the diode 401, the threshold voltage of the diode 401 can be obtained by the invention.

Practically, a standard element substrate over which an antenna coil and a circuit are formed, which has the same configuration as the TEG, is preferably measured in a contact manner. Then, the element substrate can also be measured in a contactless manner. This is because the threshold voltage Uth of the diode incorporated in the TEG and the relation between $V_0$ and $I_0$ that are measured in a contactless manner can be obtained by evaluating the standard element substrate in a contact manner and measuring the standard element substrate under the same condition, that is, the condition that the mutual inductance M, the inductance $L_2$ of the antenna coil, and parasitic resistance $R_2$ of the antenna coil are kept constant.

Note that the threshold voltage Uth can also be calculated from Formula 3 by using the mutual inductance M, the inductance $L_2$ of the antenna coil, and the parasitic resistance $R_2$ of the antenna coil. The mutual inductance M, the inductance $L_2$ of the antenna coil, and the parasitic resistance $R_2$ of the antenna coil can be obtained by using the element substrate and the measuring device of the invention. $L_2$ and $R_2$ of the antenna coil are determined in accordance with the shape and the material, and variations in manufacturing can be suppressed. Further, the mutual inductance can be maintained constant by being measured at the same position under the same measurement environment.

Figure 5C:
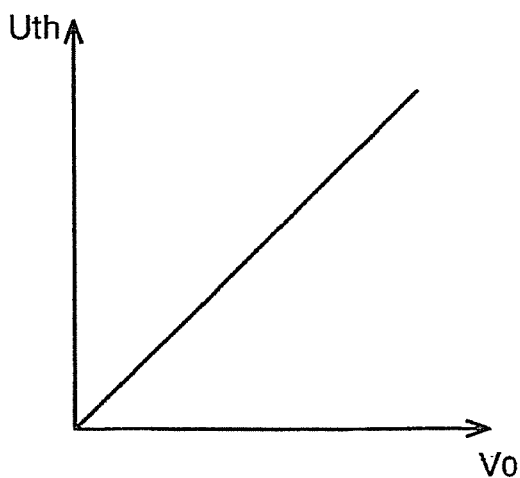

Further, when such a measurement as described in the invention is carried out for the diode having various threshold voltages Uth, a relation between the threshold voltage Uth of the diode and the voltage $V_0$ of the measuring device 104 can be obtained, for example, as shown in FIG. 5C.

Once the relation between the threshold voltage Uth of the diode over the standard element substrate and the voltage $V_0$ of the measuring device 104 is obtained, the threshold voltage of the diode can be evaluated by only being measured in a contactless manner.

As described above, in the case of evaluating element characteristics (a value such as the threshold voltage) in the invention, it is preferable that the standard element substrate which can be evaluated in a contact manner is prepared separately. On the other hand, in the case of relatively comparing the element characteristics to be evaluated, for example, when threshold voltages of a plurality of elements are compared, or a change over time of a single element is evaluated, the standard element substrate is not required to be prepared.

Note that, although description is made on the case where a diode is used as the semiconductor element 106 in this embodiment mode, the semiconductor element 106 may also be an element such as a transistor, a resistor element, or a light-emitting element. Further, the semiconductor element 106 is not limited to a single element selected from these semiconductor elements. In general, it may be an element including two terminals or a circuit including the element. In the case where the diode, the transistor, or the light-emitting element is used, the threshold voltage can be evaluated, and in the case where the resistor element is used, the resistance value can be evaluated. Thus, according to the invention, a parameter (referred to as an element parameter) which represents element characteristics such as the threshold voltage or the resistance value can be obtained in a contactless mariner. Accordingly, the element characteristics can be evaluated.

The measurement in a contactless manner is not limited to a method of measuring a voltage V and a current i of the measuring device. In general, the measurement is only required to measure the amount of power to be supplied from the measuring device 104 and the amount of power absorbed by a circuit and the like provided over the element substrate 107. For example, the aforementioned evaluation can also be carried out by the voltage V of the measuring device 104 and magnetic field intensity obtained from a magnetic field prober that is set on the periphery of the antenna coil of the element substrate 107. Such magnetic field intensity can be measured by using a spectrum analyzer.

As described above, the characteristics of a semiconductor element can be evaluated in a contactless manner owing to the element substrate of the invention. Accordingly, even in the case where it is difficult to carry out a measurement by bringing a pin into contact with an electrode pad, element characteristics can be evaluated efficiently and with high reliability. Further, electrostatic breakdown of the evaluation element can be suppressed, thereby the element characteristics can be evaluated with high reliability.

Embodiment Mode 2

Description is made on an evaluation mode of the element substrate of the invention, which is different from Embodiment Mode 1.

Figure 6:
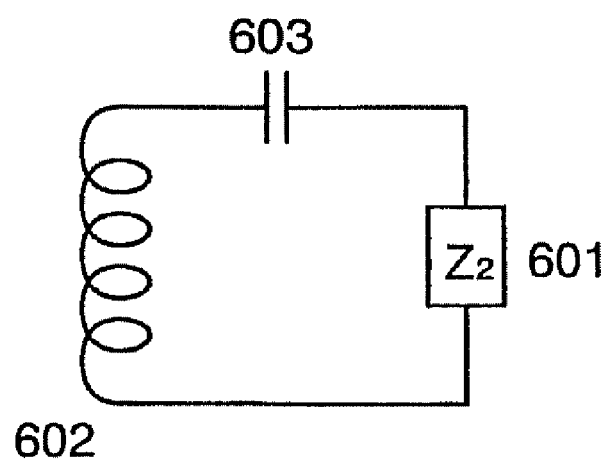
FIG. 6 is a circuit diagram formed over an element substrate of the invention.

FIG. 6 shows a model circuit diagram of an element substrate for evaluating a semiconductor element 601 having the impedance $Z_2$. A TEG provided over the element substrate includes a circuit in which an antenna coil 602, the semiconductor element 601, and a capacitor 603 are connected in series, that is, a closed-loop circuit. Note that the capacitor 603 is not necessarily provided similarly to FIG. 4.

When evaluating the TEG, it is important to determine whether characteristics of a semiconductor element are in an acceptable range in a manufacturing process of a semiconductor. Here, description is made on a method of determining whether the characteristics of the semiconductor element 601 are in an acceptable range by using the element substrate shown in FIG. 6.

First, a TEG of a standard element substrate includes an antenna coil and the semiconductor element 601, which have the same structure as the element substrate shown in FIG. 6. Then, an element substrate is prepared, over which a plurality of TEGs capable of being measured by in both a contact manner and a contactless manner are formed. In the case of carrying out a measurement in a contact manner, a connecting wire of the TEG, which is connected to an antenna and the like, is exposed. Further, in the case of carrying out a measurement in a contactless manner, an antenna is mounted on the TEG. The TEGs having these modes may be provided over the same element substrate. Needless to say, each of the TEGs may be provided over different element substrates. Furthermore, in the case of carrying out a measurement in a contactless manner, a flexible substrate can be used as an element substrate.

By using such an element substrate, the semiconductor element 601 is measured in a contact manner under the condition that the mutual inductance M, and the inductance $L_2$ and the parasitic resistance $R_2$ included in an antenna coil are kept constant. Accordingly, a relation between V-I characteristics of the semiconductor element 601 and a V-$i_1$ curve of the semiconductor element that corresponds to a result from the measurement in a contactless manner can be obtained. By measuring furthermore TEGs, and obtaining a V-$i_1$ area of the semiconductor element in variations of an acceptable range, the acceptable range can be obtained.

Figure 7A:
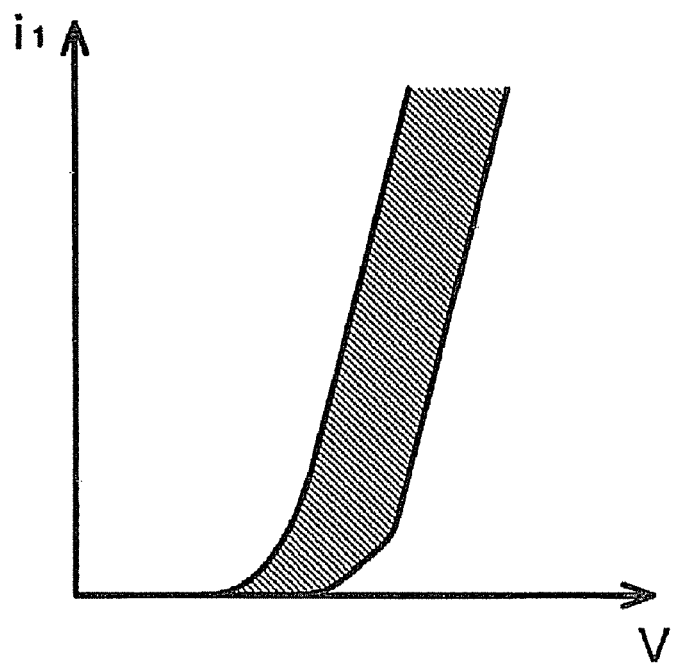
FIGS. 7A and 7B are graphs each showing a method of evaluating a semiconductor element of the invention.
Figure 7B:
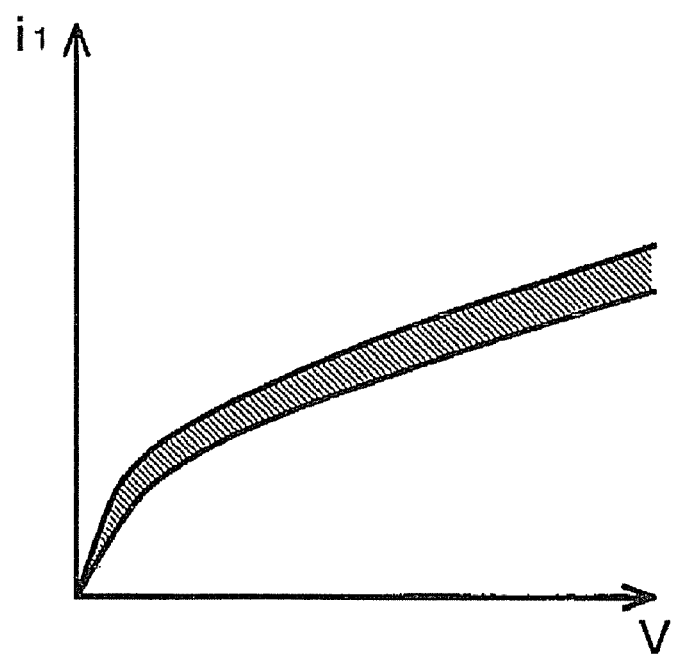

For example, when acceptable characteristics of the semiconductor element 601 are shown as a shaded area in FIG. 7A, they can be shown as a shaded area in FIG. 7B on a contactless (V, $i_1$) plane. The V-I characteristics obtained in a contact manner, which are shown in FIG. 7A, correlate with the V-I characteristics obtained in a contactless manner, which are shown in FIG. 7B, therefore, the acceptable characteristics of the semiconductor element 601 can be obtained. Based on the obtained acceptable characteristics diagram shown in FIG. 7B, the semiconductor element 601 can be evaluated in a contactless manner.

Once the acceptable characteristics of the semiconductor element 601 are obtained as an area on the (V, $i_1$) plane, whether the characteristics of the semiconductor element 601 is in an acceptable range can be determined by only being measured in a contactless manner. Note that the range of the acceptable characteristics can be determined based on specifications of a semiconductor device.

Note that this embodiment mode can be carried out in free combination with the embodiment mode described above.

Embodiment Mode 3

In this embodiment mode, description is made on a manufacturing process of a semiconductor device using the evaluating method described in Embodiment Mode 2.

Figure 17A:
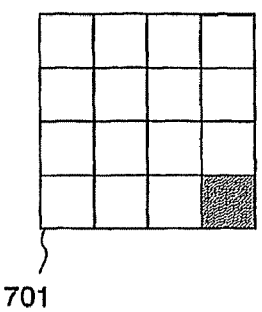
FIGS. 17A to 17D are views each showing a manufacturing method of a semiconductor device using an evaluating method of the invention.

As shown in FIG. 17A, a thin film transistor including a semiconductor layer, which forms a TEG, a chip, and the like is formed over a glass substrate 701 which is an element substrate. The thin film transistor is formed over an inflexible substrate such as a glass substrate, thereby the TEG can be inspected in a contact manner. By inspecting the TEG in a contact manner, the V-I characteristics shown in FIG. 7A are obtained (S100 in FIG. 17D). Then, the acceptable characteristic diagram in a measurement in a contactless manner (V-$i_1$ curve), which is shown in FIG. 7B, is formed (S101 in FIG. 17D).

Figure 17B:
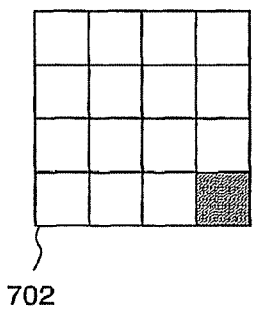

Subsequently, as shown in FIG. 17B, the glass substrate 701 is peeled off and a flexible substrate 702 is provided as an element substrate. A TEG over the flexible substrate 702 is inspected in a contactless manner (S102 in FIG. 17D). Then, whether the element substrate has acceptable characteristics in the acceptable characteristics diagram shown above is determined (S103 in FIG. 17D). The acceptable characteristics mean one of the parameters of the element substrate.

By inspecting the TEG in a contactless manner, static characteristics or dynamic characteristics of the TEG can also be obtained.

Figure 17C:
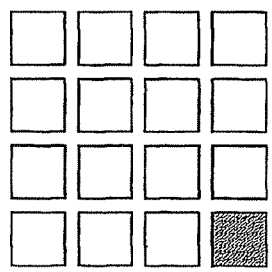
Figure 17D:
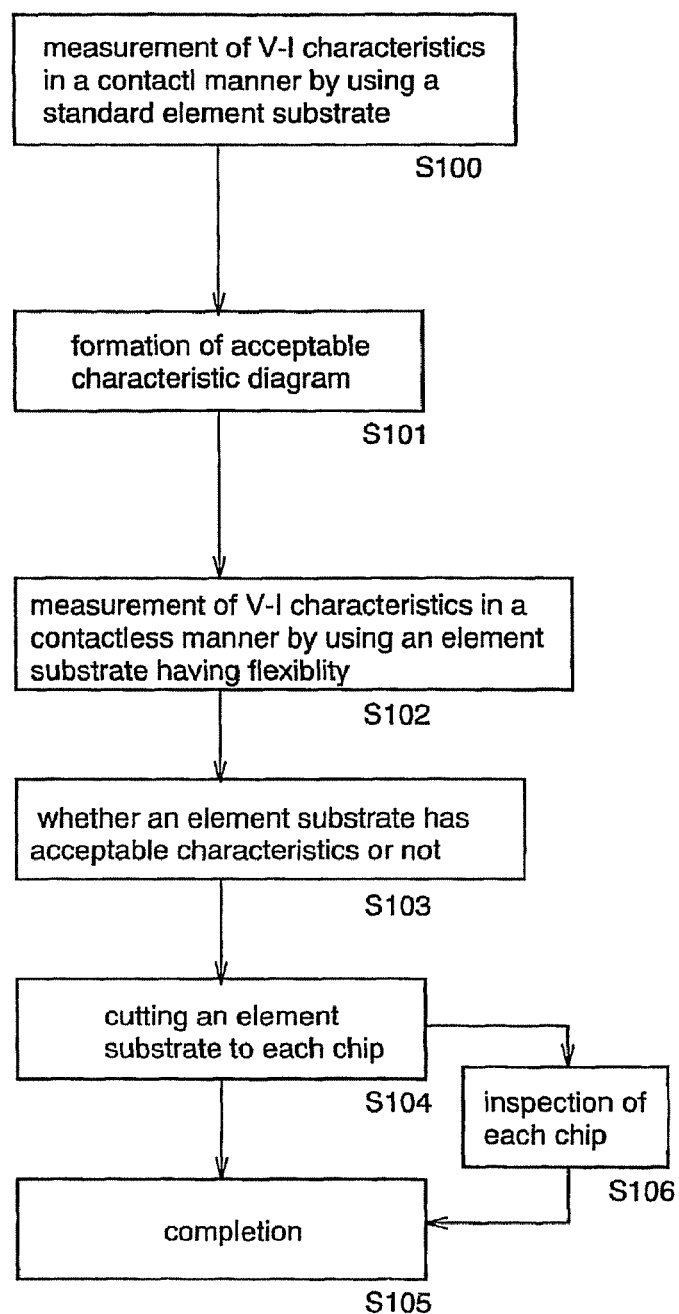

After that, as shown in FIG. 17C, an element substrate determined to have the acceptable characteristics is cut to each chip (S104 in FIG. 17D) and completed (S105 in FIG. 17D). In the abovementioned manner, the semiconductor device such as a chip can be manufactured.

At this time, each chip may be inspected (S106 in FIG. 17D). In the case of a chip incorporating an antenna, each chip can be inspected in a contactless manner. In the case of a chip incorporating no antenna, each chip can be inspected in contact with an antenna connecting terminal.

The process described above is shown by a flowchart in FIG. 17D. As shown in the flowchart, an element substrate determined to have the acceptable characteristics is cut to each chip and completed. In the abovementioned manner, the semiconductor device such as a chip can be manufactured.

By such an evaluating method using an element substrate of the invention, a defect of the semiconductor device such as a chip can be inspected for each element substrate. Accordingly, a high-speed defect inspection of the semiconductor device can be achieved.

Embodiment Mode 4

Description is made on a configuration of an element substrate and an evaluation mode of the invention, which are different from Embodiment Modes 1 and 2.

Figure 8A:
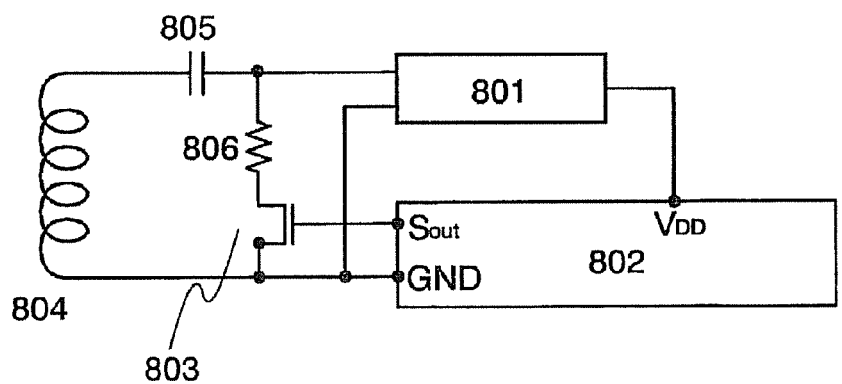
FIGS. 8A and 8B are circuit diagrams formed over an element substrate of the invention.

An element substrate of the invention includes a TEG provided with an antenna coil 804, a capacitor 805, a power source circuit 801, a transistor 803, and a ring oscillator 802 as shown in FIG. 8A. The antenna coil 804, the capacitor 805, and the power source circuit 801 are connected in series. The transistor 803 is connected in parallel to the capacitor 805 and the antenna coil 804. A gate electrode of the transistor 803 is connected to an output (Sout) of the ring oscillator 802. One terminal of the power source circuit 801 is grounded (GND), and the other terminal is connected to a power source (VDD) of the ring oscillator 802. The transistor 803 functions as a transistor for modulating the load of the antenna coil 804.

When induced electromotive force is generated in the antenna coil 804 over such an element substrate, the power source circuit 801 generates a power source voltage to be supplied to the ring oscillator 802. Being supplied with power, the ring oscillator 802 outputs a transmission signal and switching of the transistor 803 can be carried out using the transmission signal. The measuring device 104 can evaluate the oscillation frequency of the ring oscillator 802 by measuring a cycle that power supply is changed.

As a specific evaluating method, for example, the oscillation frequency of the ring oscillator is measured to evaluate its relative change. By evaluating a change over time under various stressful conditions and a change in frequency under various conditions, reliability of the ring oscillator and the power source circuit can be evaluated.

Alternatively, by employing a power source circuit used for an actual wireless chip, the oscillation frequency of the ring oscillator is measured. Since there is a correlation between the frequency characteristics of a logic circuit in a wireless chip and the frequency characteristics of the ring oscillator, the characteristics of the wireless chip manufactured in the game process can be evaluated by measuring the oscillation frequency. That is, the capability of a power source circuit included in the wireless chip can be evaluated by a ring oscillator formed as a TEG Further, reliability of the ring oscillator and the power source circuit can be evaluated by measuring electromagnetic waves radiated from the ring oscillator 802 using a magnetic field prober and either a spectrum analyzer or a oscilloscope.

Further, as described in Embodiment Mode 1 or 2, even in the case of using the ring oscillator, a standard element substrate may be prepared. The standard element substrate is provided with a ring oscillator which can be measured in a contact manner and a ring oscillator which can be measured in a contactless manner. Therefore, dynamic characteristics or static characteristics of the ring oscillator, that is, a relation between the oscillation frequency and a power source can be evaluated. Further, as described in Embodiment Mode 1 or 2, an acceptable characteristic range can be determined by providing more ring oscillators.

Figure 8B:
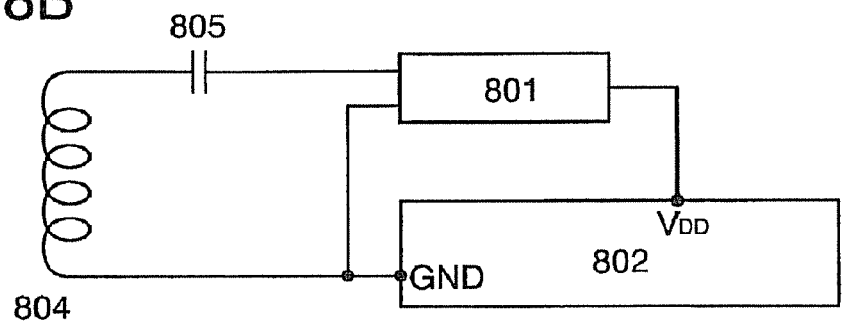

Note that as shown in FIG. 8B, the transistor 803 may be omitted as far as the measurement and the evaluation can be carried out. The transistor 803 is not required to be provided if load modulation is not required, because the transistor 803 is provided for modulating the load of an antenna coil.

Note that this embodiment mode can be carried out in free combination with the embodiment modes described above.

Embodiment

Embodiment 1

A specific example of the power source circuit 801 used in Embodiment Mode 4 is described.

Figure 9:
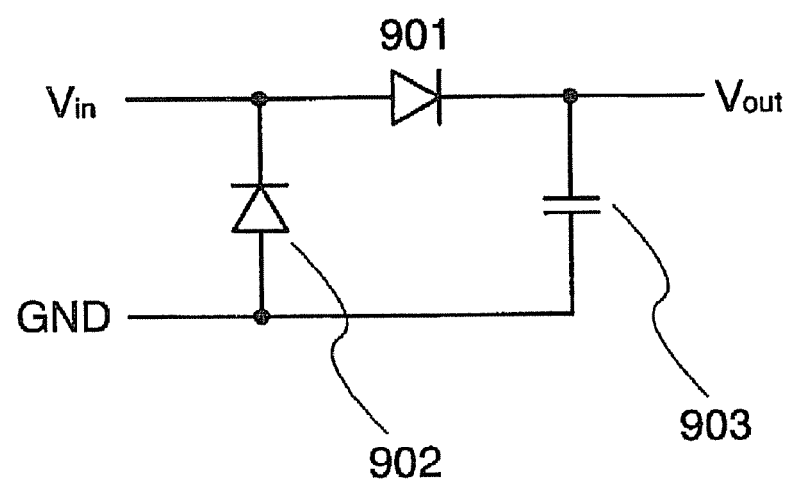
FIG. 9 is a circuit diagram of a power source circuit formed over an element substrate of the invention.

In a power source circuit shown in FIG. 9, diodes 901 and 902 are connected in series, and a capacitor 903 is provided between an output of the diode 901 and an input of the diode 902. The input of the diode 902 is grounded (GND). Such a power source circuit inputs an alternating current signal with an amplitude Vin to an input of the diode 901, and outputs a power source voltage Vout. The inputted alternating current signal is rectified by the diode 901 and stabilized by the capacitor 903.

Figure 10:
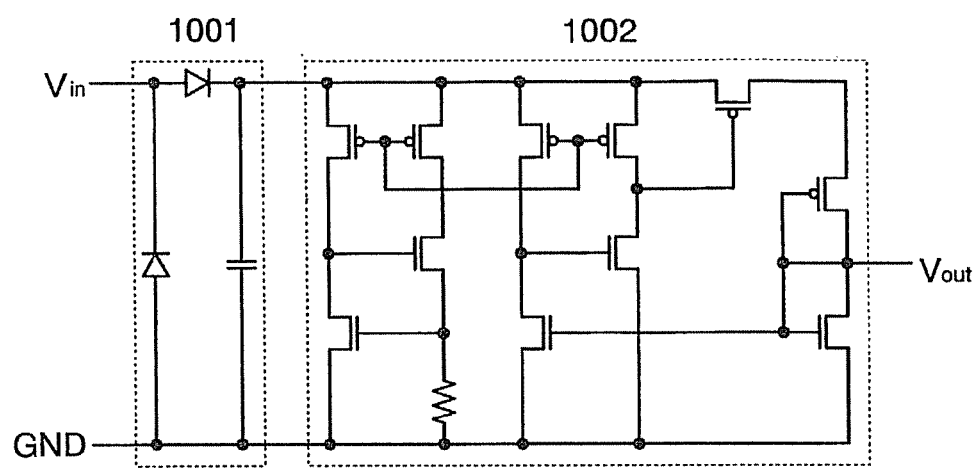
FIG. 10 is a circuit diagram of a power source circuit formed over an element substrate of the invention.
Figure 11:
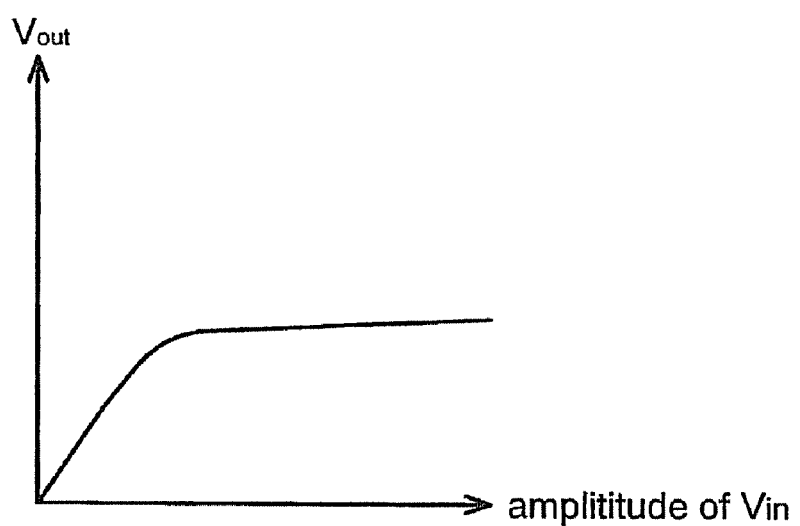
FIG. 11 is a characteristic curve of a power source circuit formed over an element substrate of the invention.

In a power source circuit shown in FIG. 10, a regulator 1002 is provided at a subsequent stage of a power source 1001 which corresponds to the power source circuit shown in FIG. 9. The regulator 1002 is a circuit for holding an output voltage almost constant regardless of an input voltage, and a known circuit can be used for the regulator 1002. The power source circuit shown in FIG. 10 is preferable in that a stable voltage can be outputted without depending so much on the amplitude Vin of an alternating current signal to be inputted as shown in FIG. 11.

Embodiment 2

A TEG of the invention can be applied even in the case of being measured in a contact manner. The less electrode pads are brought into contact with, the less static breakdown occurs. Further, although it is difficult that a flexible chip is measured in a contact manner with a large number of electrode pads, the flexible chip can be measured in a contact manner with a small number of electrode pads in some cases.

Figure 12:
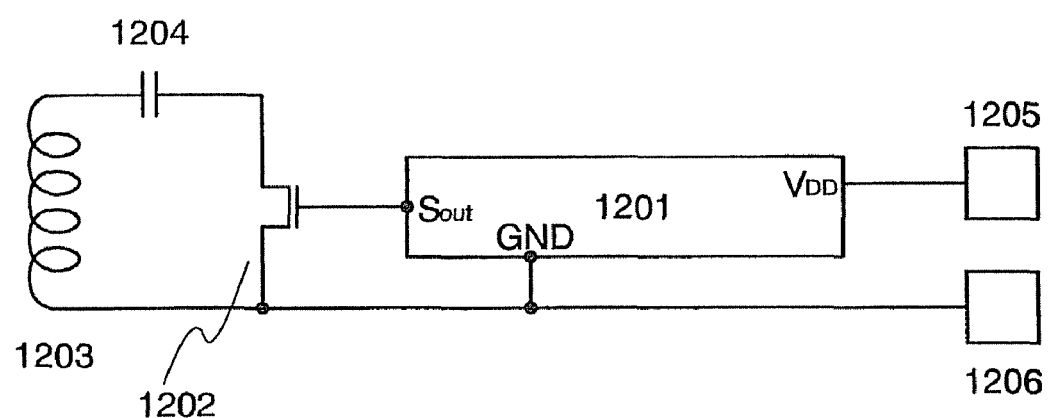
FIG. 12 is a circuit diagram formed over an element substrate of the invention.
Figure 13:
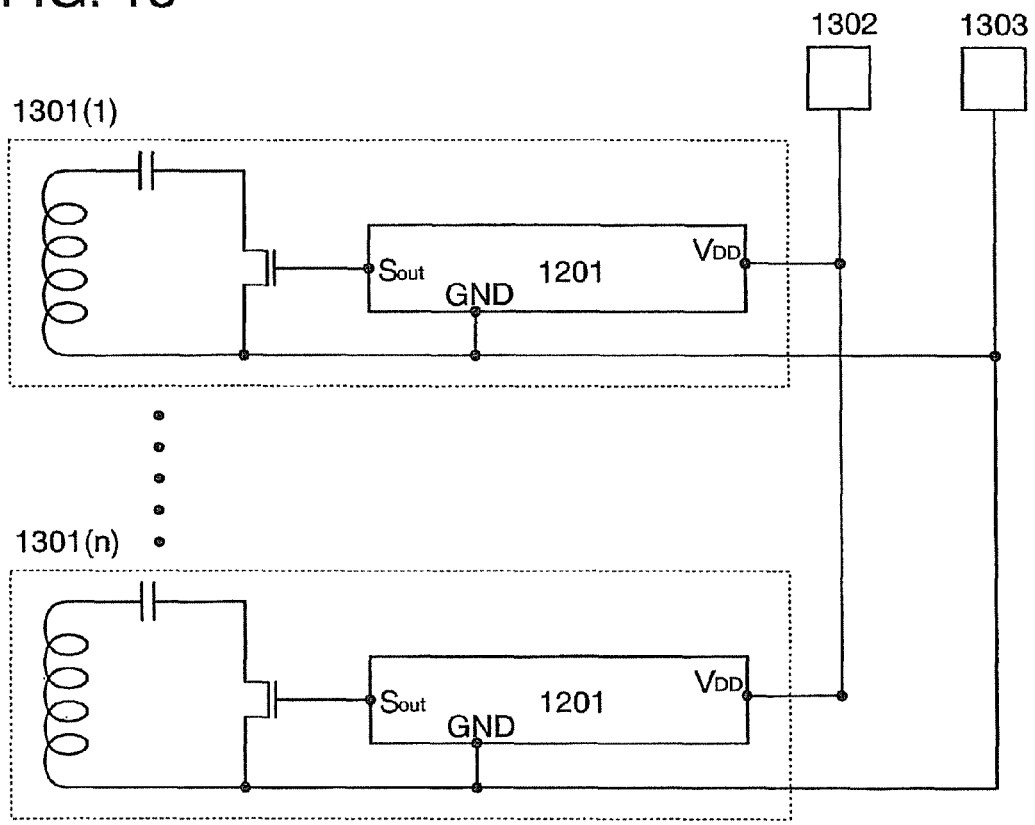
FIG. 13 is a circuit diagram formed over an element substrate of the invention.

In such a case, an element substrate provided with such a LEG as shown in model circuit diagrams of FIGS. 12 and 13 may be used. A LEG shown in FIG. 12 includes a capacitor 1204, an antenna coil 1203, a transistor 1202, a ring oscillator 1201, and two power source pads 1205 and 1206. A power source voltage is supplied from the power source pads 1205 and 1206. In addition, a power source (VDD) and a GND of the ring oscillator 1201 are connected to the power source pads 1205 and 1206 respectively. Such a TEG is referred to as a ring oscillator evaluation circuit. The ring oscillator evaluation circuit can be described as a circuit capable of measuring oscillation frequency wirelessly.

Such an element substrate having the ring oscillator evaluation circuit can measure both a power source voltage to be inputted and oscillation frequency. Therefore, the characteristics of the ring oscillator 1201 can be evaluated accurately. Accordingly, the characteristics of a circuit formed of a thin film transistor can be evaluated accurately.

As a configuration to decrease the number of electrode pads, a plurality of ring oscillator evaluation circuits 1301(1) to 1301(n) may be connected in parallel using two electrode pads 1302 and 1303 in common. By connecting the plurality of ring oscillator evaluation circuits, characteristics evaluation can be carried out more accurately.

Note that this embodiment can be freely combined with the embodiment modes described above, or substituted by the TEG of the embodiment modes described above.

Embodiment 3

In this embodiment, description is made on a measurement result of an element substrate having a ring oscillator evaluation circuit by a spectrum analyzer.

Figure 14:
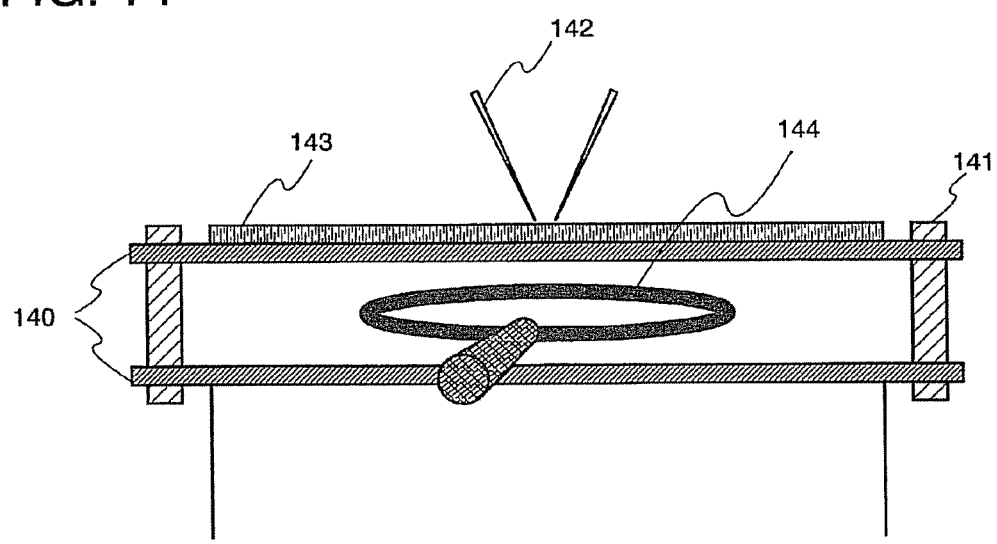
FIG. 14 is a model diagram of measurement by a spectrum analyzer.

As shown in FIG. 14, an antenna coil for a spectrum analyzer 144 is inserted between a pair of bases 140 supported by a spacer 141. A pico probe pin 142 is brought into contact with an evaluation element substrate 143 having a ring oscillator evaluation circuit which is disposed over one of the bases, thereby, measurement frequency is outputted to a connected oscilloscope. Note that 51 stages of ring oscillators are disposed, a channel width of an n-channel thin film transistor is set to 10 µm, the channel width of a p-channel thin film transistor is set to 20 µm, the channel length of both of the thin film transistors is set to 1 µm, and the thickness of a gate insulating film is set to 40 nm. Further, the n-channel thin film transistor has an LDD structure and the p-channel thin film transistor has a single drain structure.

Figure 15:
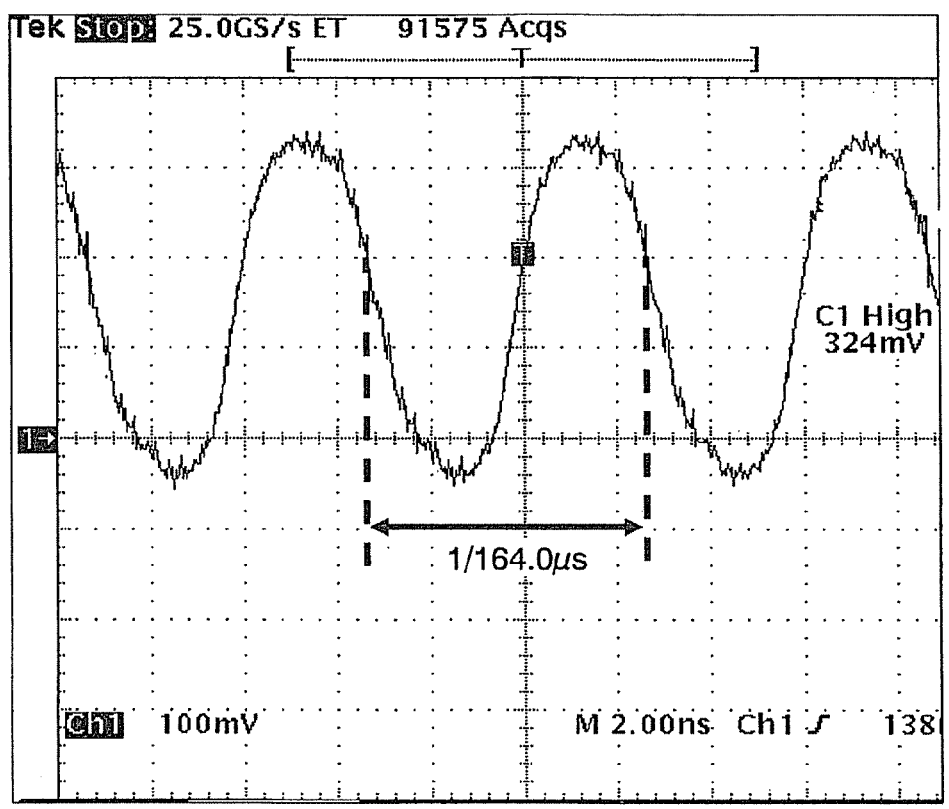
FIG. 15 shows a measurement result of the oscillation frequency of a ring oscillator by an oscilloscope.
Figure 16:
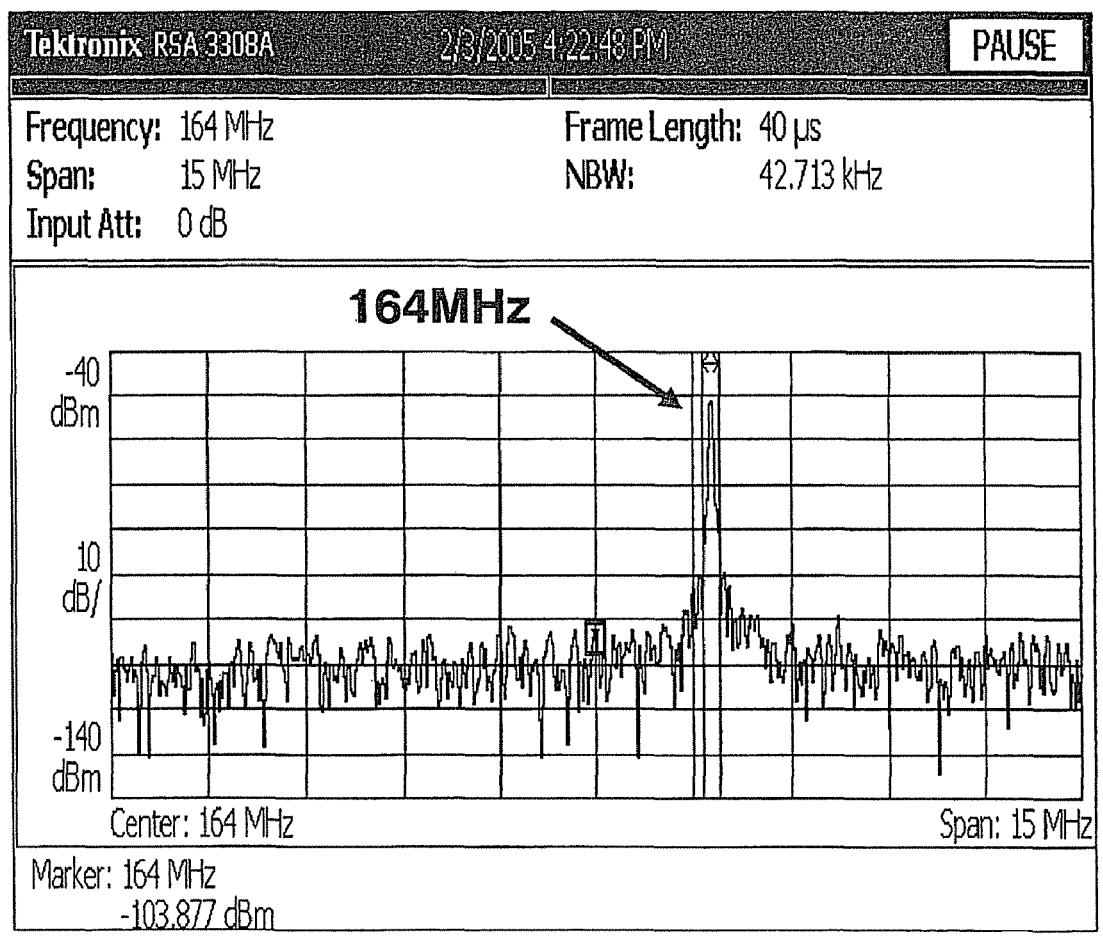
FIG. 16 shows a measurement result of the oscillation frequency of a ring oscillator by a spectrum analyzer.

FIG. 15 shows a measurement result of the oscillation frequency of a ring oscillator by an oscilloscope. FIG. 16 shows a measurement result of the oscillation frequency of a ring oscillator by a spectrum analyzer. Since a wave form shown in FIG. 15 almost corresponds to a wave form shown in FIG. 16, it is found that the oscillation frequency of a ring oscillator evaluation circuit can be measured in a contactless manner by a spectrum analyzer using a contactless antenna.

This application is based on Japanese Patent Application serial no. 2005-061717 filed in Japan Patent Office on 7th Mar. 2005, and the entire contents of which are hereby incorporated by reference.

The invention claimed is:

1. An inspecting method of an element substrate comprising:
    applying an electromagnetic wave to the element substrate comprising a test elementary group including a closed-loop circuit in which an antenna coil and a semiconductor element are electrically connected in series; and
    evaluating characteristics of the semiconductor element by measuring power absorbed by the element substrate.

2. The inspecting method of an element substrate according to claim 1, wherein the element substrate has flexibility.

3. The inspecting method of an element substrate according to claim 1, wherein the power absorbed by the element substrate is measured by a magnetic field prober.

4. The inspecting method of an element substrate according to claim 1, wherein static characteristics of the semiconductor element is evaluated in a contactless manner.

5. An inspecting method of an element substrate comprising:
    applying an electromagnetic wave to the element substrate comprising an antenna coil and a semiconductor element which are electrically connected in series; and
    evaluating characteristics of the semiconductor element by measuring power absorbed by the element substrate.

6. The inspecting method of an element substrate according to claim 5, wherein the element substrate has flexibility.

7. The inspecting method of an element substrate according to claim 5, wherein the power absorbed by the element substrate is measured by a magnetic field prober.

8. The inspecting method of an element substrate according to claim 5, wherein static characteristics of the semiconductor element is evaluated in a contactless manner.

* * * * *